United States Patent
Rochet et al.

[19]

[11] Patent Number: 5,929,766
[45] Date of Patent: Jul. 27, 1999

[54] DEVICE FOR CONTROLLING SEMICONDUCTOR WAFER TRANSPORT CASSETTES

[75] Inventors: André Rochet; Pascal DeCamps, both of Meylan, France

[73] Assignee: STMicroelectronics, S.A., Gentilly, France

[21] Appl. No.: 08/796,178

[22] Filed: Feb. 7, 1997

[30] Foreign Application Priority Data

Feb. 8, 1996 [EP] European Pat. Off. .................. 01765

[51] Int. Cl.$^6$ .................................................. G08B 21/00
[52] U.S. Cl. .................. 340/686.2; 340/525; 340/686.4; 340/686.5; 340/691.1; 414/940
[58] Field of Search ..................... 340/686, 691, 340/524, 525, 674, 675, 676; 414/940; 425/138, 135; 264/40.5, 40.1; 198/502.3, 502.1, 464.1, 464.2, 464.4; 364/468.17, 474.16–474.2, 474.28, 474.34, 475.02, 475.09, 478.06

[56] References Cited

U.S. PATENT DOCUMENTS

| | | | |
|---|---|---|---|
| 4,776,744 | 10/1988 | Stonestreet et al. | 414/940 X |
| 4,836,733 | 6/1989 | Hertel et al. | 414/939 X |
| 4,907,931 | 3/1990 | Mallory et al. | 414/936 X |
| 4,996,436 | 2/1991 | Doeuvne et al. | 250/559.4 |
| 5,291,025 | 3/1994 | Smith | 250/559.36 |
| 5,485,759 | 1/1996 | Goff et al. | 73/865.9 |

FOREIGN PATENT DOCUMENTS

| | | |
|---|---|---|
| 0 387 164 | 9/1990 | European Pat. Off. . |
| 1303734 | 12/1989 | Japan . |
| 75361 | 3/1992 | Japan ................ 414/940 |
| 4256333 | 9/1992 | Japan . |
| 5047725 | 2/1993 | Japan . |

*Primary Examiner*—Thomas Mullen
*Attorney, Agent, or Firm*—David V. Carlson; Kevin S. Ross; Seed and Berry LLP

[57] ABSTRACT

The invention relates to a dimensional control device for semiconductor wafer transport cassettes. Each cassette has a base from which extend vertical walls including horizontal grooves designed to receive wafers by lateral insertion. The device includes a seat provided with positioning guides of a cassette base; switches placed on the seat so that the actuation of all the switches by the positioned base indicate a suitable planarity of the base; a drawer mounted slidably on the seat so as to be engageable in the cassette in the insertion direction of the wafers, and having at least one template corresponding to a high position groove of the cassette; and a stop placed on the seat, at the side opposite to the drawer with respect to the cassette, to cause a tilting of the cassette when the drawer is moved towards the cassette and the template does not correspond to the cassette.

18 Claims, 2 Drawing Sheets

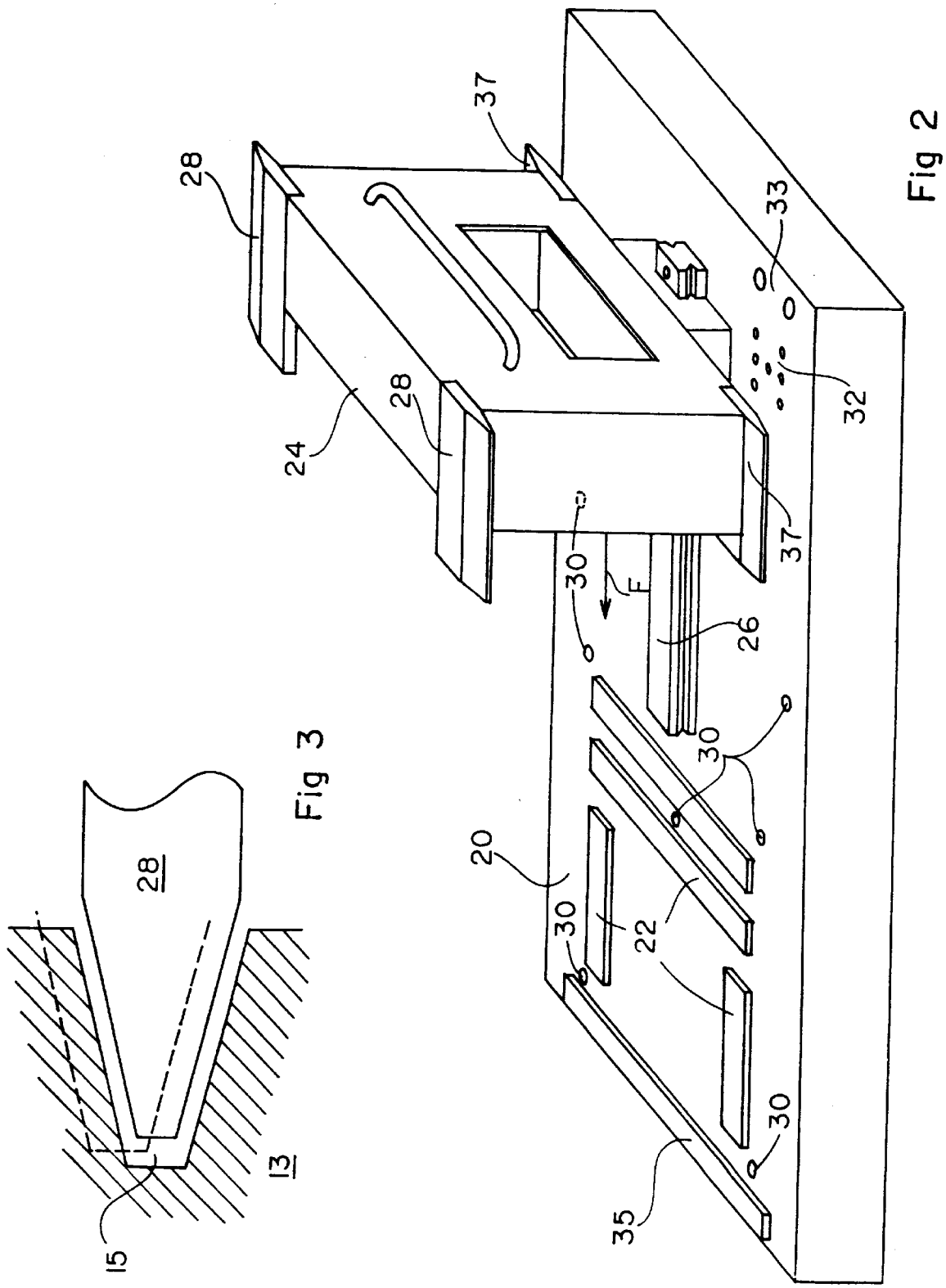

DEVICE FOR CONTROLLING SEMICONDUCTOR WAFER TRANSPORT CASSETTES

BACKGROUND OF THE INVENTION

1. Field of the Invention

The present invention relates to a dimensional control device for cassettes used to transport semiconductor wafers from one processing site to another.

2. Discussion of the Related Art

FIGS. 1A and 1B are a front view and a top partial cross-sectional view of a conventional cassette to transport wafers.

In FIG. 1A, the cassette is shown from the side of an aperture through which the wafers are inserted. The cassette includes a base 12 from which extend, on both sides, two vertical walls 13. Walls 13 include horizontal grooves 15 with trapezoidal section. Each groove 15 of one wall 13 is in the same plane as a groove 15 of the other wall 13, so that both these grooves form a single groove designed to receive a wafer. A wafer 10 is shown in place.

As shown in FIG. 1B, walls 13 include a linear portion 13-1 at the side of the insertion aperture, and a curved portion 13-2 at the rear, which matches the shape of the wafers and forms a stop for them.

The cassettes are used to transport sets of wafers from one processing site to another. At each site, the cassettes are loaded and unloaded one after the other with a robot. Of course, for the robot to be able to suitably handle the wafers, it is necessary that the positions of the grooves 15 vary little with respect to corresponding reference positions.

For this purpose, the seat on which each cassette rests in a processing site includes guides cooperating with the base 12 of the cassette to ensure that the cassette is always positioned in the same manner on the seat. This allows linking the reference of the cassette to the reference of the robot.

The accuracy of the positioning depends upon the geometrical variations of each cassette. Often the geometry of the cassettes, molded in plastics, varies with time, so that some wafers will not always be in the position expected by the robot. The wafers are then usually broken by the robot.

A current geometrical variation of the cassettes is the warping of base 12, so that the cassette does not rest on the seat with a plane-to-plane contact. As a result the grooves are higher on one side than the other and the wafers are tilted instead of being horizontal.

A variation in height of the cassette causes a vertical shift of the grooves.

An inclination of the cassette with respect to its base causes a lateral shift of the grooves, the shift increasing with the elevational position of the grooves.

Various devices exist for controlling the dimensions of the cassettes.

Among the simplest control devices, Fluoroware's device, called "Wafer Carrier Go/No-Go Gauge," includes a drawer for sliding into the cassette to be controlled a set of fictive wafers in the form of a stack of disks. The cassette is of course suitably positioned with respect to a seat of the device. If resistance is felt to the penetration of the disks, it means that the cassette is bad.

This device does not enable an easy control of the planarity of the base of the cassette. Indeed, in this case, while the disks penetrate into the cassette, they tend to straighten the cassette without a high resistance being felt, this being due to the fact that the material of the cassettes has a low friction coefficient and that the walls of the grooves are little slanted.

Thus, the detection of a defect highly depends upon the sensitivity of the operator of the control device.

In addition, the device is particularly expensive, especially because it includes a stack of a large number of disks, often 25, which should be accurately manufactured and accurately mounted in the drawer.

Other devices allow more complete and accurate controls of cassettes, but they use measurement technologies which are sophisticated and significantly more expensive than those of the above described drawer device.

SUMMARY OF THE INVENTION

An object of the present invention is to provide a device for controlling cassettes which allows a reliable and complete control in a short time, and which has an inexpensive structure.

To achieve this object the present invention provides a dimensional control device for semiconductor wafer transport cassettes. Each cassette has a base from which extend vertical walls including horizontal grooves designed to receive wafers by lateral insertion. The device includes a seat provided with positioning guides of a cassette base; switches placed on the seat so that the actuation of all the switches by the positioned base indicate a suitable planarity of the base; a drawer mounted slidably on the seat so as to be engageable in the cassette in the insertion direction of the wafers, and having at least one template corresponding to a high position groove of the cassette; and a stop placed on the seat, at the side opposite to the drawer with respect to the cassette, to cause a tilting of the cassette when the drawer is moved towards the cassette and the template does not correspond to the cassette.

According to an embodiment of the present invention, the template includes straight portions parallel to the insertion direction of the wafers.

According to an embodiment of the present invention, the drawer includes a second template corresponding to a low position groove of the cassette, the second template being offset in a rearward direction with respect to the first template along the insertion direction of the wafers.

According to an embodiment of the present invention, the seat includes six switches placed according to an "H" pattern.

According to an embodiment of the present invention, the seat includes an additional switch placed at the center of the base.

According to an embodiment of the present invention, the device includes a lamp to indicate the actuation of each switch.

According to an embodiment of the present invention, the device includes a first color general lamp to indicate that all the switches are actuated and a second color general lamp to indicate that at least one switch is not actuated.

The foregoing and other objects, features, aspects and advantages of the invention will become apparent from the following detailed description of embodiments, given by way of illustration and not of limitation with reference to the accompanying drawings.

BRIEF DESCRIPTION OF THE DRAWINGS

FIG. 2 is a perspective view of an embodiment of a control device according to the invention.

FIG. 3 illustrates the positions of a template of the device of FIG. 2 during a control of a good cassette and of a bad cassette.

DETAILED DESCRIPTION OF THE INVENTION

Figure 1A:
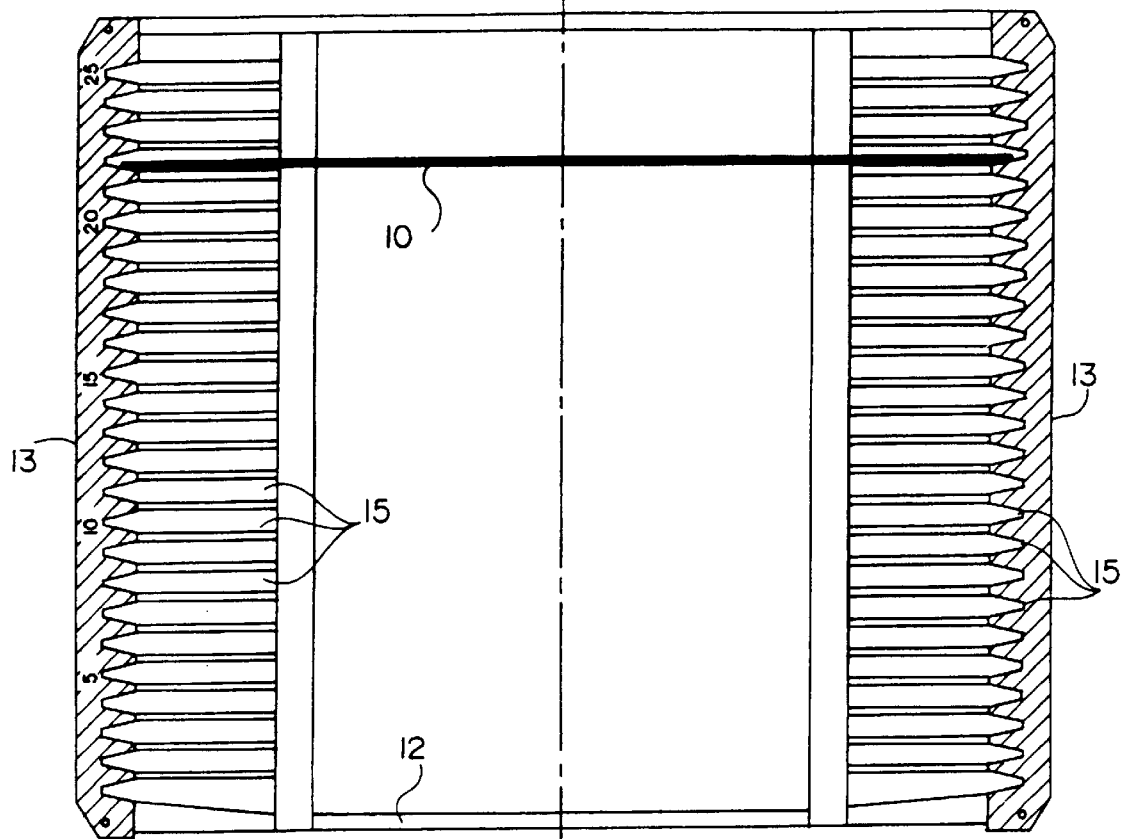
FIGS. 1A and 1B, above described, show a front view and a top partially cross-sectional view of a conventional transport cassette for semiconductor wafers.
Figure 1B:
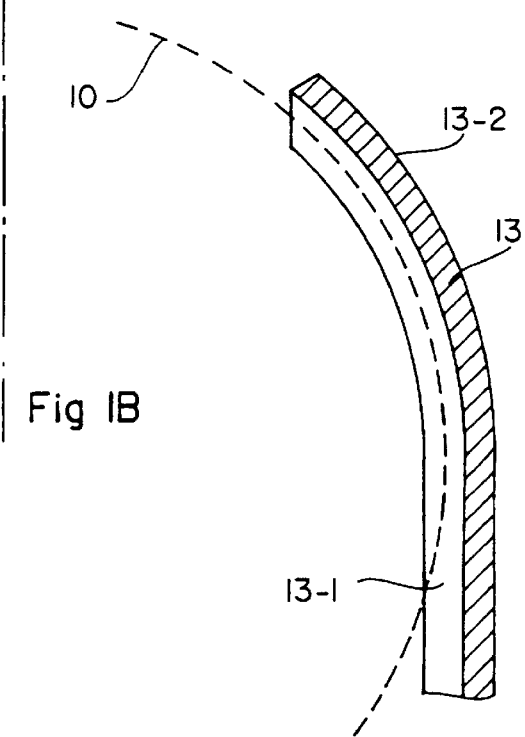

The present invention is based on an analysis of the current defects of transport cassettes. Whatever the defect, especially a planarity defect of base 12 or a height defect of the cassette, the defect is amplified at the upper grooves of the cassette. It has thus been noticed that, if a cassette has a defect, this defect is most of the time detectable by examining only one of the upper grooves, preferably the last one.

In FIG. 2, a control device according to the invention includes a seat 20 on which a cassette to be controlled is placed with the help of guides 22 which ensure an accurate positioning of the base of the cassette. The cassette is not shown for the sake of clarity. A drawer 24 is mounted on seat 20 through a slide rail 26 placed at the aperture side of the cassette and along the introduction direction of the wafers into the cassette. Slide rail 26 is so placed that drawer 24 can slide directly into the cassette. Slide rail 26, which ensures an accurate guiding of drawer 24, is for example a ball bearing slide rail.

The upper portion of drawer 24 is provided with a template corresponding to the highest groove 15 of the cassette to be controlled. The template is in fact formed by two half-templates 28 placed, with respect to slide rail 26, on either side of drawer 24. Preferably, the two half-templates 28 respectively correspond to the two straight ends of the highest groove 15, i.e., to the portions of the groove which are in the straight portions 13-1 of walls 13. The half-templates 28 are thus preferably straight and parallel to slide rail 26.

The portion of seat 20 upon which the base 12 of the cassette rests includes protruding switch buttons 30. The switches are distributed so that they are all actuated by the contact of the base with the seat when the base has a suitable planarity. As a result, if one or more switches are not actuated, the planarity of the base will be considered insufficient.

As shown by way of example, seat 20 includes four switches 30 at the corners of the base of the cassette, a switch approximately in the middle of the cassette, and two switches placed, each, on one side of the base, between the front and the back of the base.

Generally, base 12 includes ribs approximately forming an "H," by which the cassette contacts the seat. Switches 30 are thus placed according to an "H."

Thus, the planarity control of the base of a cassette is achieved as soon as the cassette is positioned on seat 20. The planarity measurement is indicated, for example, by lamps 32 indicating the state of each switch 30. To simplify the control, two general lamps 33 of different colors may be provided, the first, for example green, being on when all the switches are actuated, and the second, for example red, being on when one or more switches are not actuated. The green lamp thus indicates that the cassette is good and the red lamp indicates that the cassette is bad.

Lamps 32 allow the detection of a type of the planarity defect, which is useful for controlling a batch of new cassettes. If several cassettes of the batch have the same defect, this certainly means that there is a manufacturing defect and that the whole batch is defective.

On seat 20, at the side opposite to drawer 24, a stop 35 is provided contacting the back of the base of the controlled cassette. This stop 35 may be used, like guides 22, to position the cassette.

If no planarity defect is detected by switches 30, drawer 24 is pushed along arrow F to engage it into the cassette to be controlled. The half-templates 28 are then engaged in the last groove 15 of the cassette.

FIG. 3 shows, for a half-template 28 in solid lines, a good cassette control. Template 28 travels along the straight portion of groove 15 with enough clearance between the walls of the template and the walls of the grooves.

In contrast, if the cassette is bad, groove 15 is wrongly placed. As a result, as shown by a half-template in dotted lines, the template 28 cannot penetrate inside groove 15 and abuts against the front face of the cassette. The cassette then tilts about stop 35 causing the deactivation of the switches 30 which are most distant from stop 35. The red lamp 33 immediately indicates a defect.

An advantage due to the fact that the half-templates 28 are straight is that, in case of a defect, a contact of the half-templates with the front face of the cassette is obtained without the half-templates engaging inside groove 15. If the half-templates were rounded, the contact would occur most of the time on the slanted walls of the groove 15, wherein the template is engaged in the groove and impedes the tilting of the cassette about stop 35.

As shown, drawer 24 may include at its lower portion two half-templates 37 corresponding to one of the lowest grooves of the cassette. For template 37 not to impede the tilting of the cassette about stop 35, template 37 is retracted with respect to the upper template 28, in the travel direction of drawer 24.

The lower template 37 is used, for example, to check if the lowest groove is in the good position despite the base being warped. This control is achieved by detecting no resistance when pushing the drawer 24, or, without pushing the drawer, by detecting by eyesight the correspondence between the lower groove and template 37.

In a practical implementation, the vertical clearance between template 28 and the walls of groove 15 is 0.5 mm, and the horizontal clearance is 1 mm. The displacement of switches 30 before actuation is approximately 0.5 mm, i.e., the planarity of a base is assumed to be suitable when each switch 30 protrudes from the upper surface of seat 20 by a length shorter than 0.5 mm at the locations where the base is assumed to contact the seat.

With the above explanations, those skilled in the art will easily realize the electrical circuitry connecting the switches to the lamps 32, 33. In addition, they will know which positions to adopt for the switches 30 and the positioning guides 22, 35 depending on the cassettes to be controlled. As an alternative, the information of some switches could be ignored, those ignored switches being selected depending on a type of cassette to be controlled.

Having thus described at least one illustrative embodiment of the invention, various alterations, modifications and improvements will readily occur to those skilled in the art. Such alterations, modifications, and improvements are intended to be within the spirit and scope of the invention. Accordingly, the foregoing description is by way of example only and is not intended to be limiting. The invention is limited only as defined in the following claims and the equivalents thereto.

We claim:

1. A dimensional control device for semiconductor wafer transport cassettes, each cassette having a base from which extend vertical walls including horizontal grooves designed to receive wafers by lateral insertion, the device including:

a seat provided with positioning guides of a cassette base;

switches placed on the seat so that the actuation of all the switches by the positioned base indicate a suitable planarity of the base;

a drawer mounted slidably on the seat so as to be engageable in the cassette in the insertion direction of the wafers, and having at least one template corresponding to a high position groove of the cassette; and a stop placed on the seat, at the side opposite to the drawer with respect to the cassette, to cause a tilting of the cassette when the drawer is moved towards the cassette and the template does not correspond to the cassette.

2. The control device of claim 1 wherein the template includes straight portions parallel to the insertion direction of the wafers.

3. The control device of claim 1 wherein the drawer includes a second template corresponding to a low position groove of the cassette, the second template being retracted with respect to the first template along the insertion direction of the wafers.

4. The control device of claim 1 wherein the seat includes six switches placed according to an "H."

5. The control device of claim 4 wherein the seat includes an additional switch placed at the center of the base.

6. The control device of claim 1, including a lamp to indicate the actuation of each switch.

7. The control device of claim 6, including a first color general lamp for indicating that all the switches are actuated and a second color general lamp for indicating that at least one switch is not actuated.

8. A method to measure a wafer transport cassette, comprising the steps of:

placing the cassette in a base having a plurality of guides to prevent movement of the cassette and the base having a plurality of switches located to contact a bottom plane of the cassette, each switch connected to a separate lamp which is extinguished when the respective switch is depressed;

sliding a drawer towards the cassette, the drawer having tabs near the top to enter into one of a plurality of grooves in the cassette if acceptable or the tabs striking the cassette if the cassette is unacceptable;

observing the lamps which light if the drawer strikes the cassette and which do not light if the drawer slides into the cassette;

rejecting the cassette as unacceptable if any of the lamps light after the drawer has slid into the area occupied by the cassette.

9. A method to measure one or more receiving areas in a batch of transport cassettes, comprising the steps of:

placing a first cassette in a base having a plurality of guides to prevent movement of the first cassette and the base having a plurality of switches located to contact a bottom plane of the first cassette, each switch connected to a separate lamp which is extinguished when the respective switch is depressed;

sliding a drawer towards the first cassette, the drawer having tabs near the top to enter into one of a plurality of grooves in the first cassette if acceptable or the tabs striking the first cassette if the first cassette is unacceptable;

observing the lamps which light if the drawer strikes the first cassette and which do not light if the drawer slides into the first cassette;

rejecting the first cassette as unacceptable if any of the lamps light after the drawer has slid into the area occupied by the first cassette;

repeating the method disclosed above for a statistically significant portion of the batch; and rejecting the entire batch of cassettes if the same lamps are lit for a significant number of cassettes in the batch.

10. A method to measure a wafer transport cassette, comprising the steps of:

placing the cassette in a base having a plurality of guides to prevent movement of the cassette;

sliding a drawer towards the cassette;

maintaining the cassette in the same position if the drawer does not strike the cassette;

moving the cassette if the drawer strikes the cassette, causing one of a plurality of switches to light a respective lamp; and rejecting the cassette as unacceptable if any lamp lights.

11. A device to detect imperfect wafer transport cassettes, comprising:

a seat for accepting the cassette;

a plurality of guides located to mate with a properly positioned cassette;

a plurality of switches mounted to the seat all set to activate by a properly positioned cassette;

a slide rail mounted to the seat; and a sliding drawer connected to the slide rail.

12. The device of claim 11 whereby the switches are mounted in a pattern representing an "H."

13. The device of claim 11, further including a lamp connected to each switch, each lamp lit unless the corresponding switch is depressed.

14. The device of claim 13, further including a second lamp connected to illuminate if all switches are depressed.

15. The device of claim 14, further including a third lamp connected to illuminate if one or more switches fails to complete the respective circuit.

16. The device of claim 11 whereby tabs are affixed to the sliding drawer along a plane parallel to a front face of the cassette.

17. The device of claim 16 further including additional tabs mounted below and recessed in a rearward direction from the first tabs.

18. The device of claim 16 whereby the vertical clearance between a tab and an edge of the groove is 0.5 millimeter and the horizontal clearance is 1 millimeter.

* * * * *